(12) United States Patent
Park et al.

(10) Patent No.: US 11,680,987 B2
(45) Date of Patent: *Jun. 20, 2023

(54) METHOD AND APPARATUS WITH BATTERY MANAGEMENT

(71) Applicants: SAMSUNG ELECTRONICS CO., LTD., Suwon-si (KR); SAMSUNG SDI CO., LTD., Yongin-si (KR)

(72) Inventors: Sangdo Park, Seoul (KR); Young Hun Sung, Hwaseong-si (KR); Tae Won Song, Yongin-si (KR); Tae Kyung Lee, Yongin-si (KR)

(73) Assignees: Samsung Electronics Co., Ltd., Suwon-si (KR); SAMSUNG SDI CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/864,729

(22) Filed: Jul. 14, 2022

(65) Prior Publication Data
US 2022/0349942 A1 Nov. 3, 2022

Related U.S. Application Data

(63) Continuation of application No. 16/512,484, filed on Jul. 16, 2019, now Pat. No. 11,422,191.

(30) Foreign Application Priority Data

Jan. 11, 2019 (KR) .................. 10-2019-0003843

(51) Int. Cl.
G01R 31/367 (2019.01)
G01R 31/36 (2020.01)
(Continued)

(52) U.S. Cl.
CPC ....... *G01R 31/367* (2019.01); *G01R 31/3646* (2019.01); *G01R 31/3648* (2013.01); *G01R 31/382* (2019.01); *G01R 31/396* (2019.01)

(58) Field of Classification Search
CPC .................................................. G01R 31/367
(Continued)

(56) References Cited

U.S. PATENT DOCUMENTS 9,664,746 B2    5/2017   Glover et al.
2014/0214348 A1 7/2014   Sahinoglu et al.
(Continued)

FOREIGN PATENT DOCUMENTS

JP    4864282 B2    2/2012
JP    5315953 B2    10/2013
JP    2016-70682 A  5/2016

*Primary Examiner* — Ricky Go
(74) *Attorney, Agent, or Firm* — NSIP Law

(57) ABSTRACT

A processor-implemented battery management method includes: estimating state information of a plurality of battery cells in a battery pack using a first battery state estimation model; determining whether state information of at least one of the plurality of battery cells is to be estimated using a second battery state estimation model; and estimating the state information of the at least one battery cell using the second model, in response to a result of the determining being that the state information of the at least one battery cell is to be estimated using the second model.

20 Claims, 9 Drawing Sheets

(51) Int. Cl.
*G01R 31/396* (2019.01)
*G01R 31/382* (2019.01)

(58) Field of Classification Search
USPC .......................................................... 702/63
See application file for complete search history.

(56) References Cited

U.S. PATENT DOCUMENTS

| | | |
|---|---|---|
| 2014/0333317 A1 | 11/2014 | Frost et al. |
| 2014/0347012 A1 | 11/2014 | Shim et al. |
| 2015/0251555 A1 | 9/2015 | Li et al. |
| 2016/0016482 A1 | 1/2016 | Lee |
| 2016/0124051 A1 | 5/2016 | Prasad et al. |
| 2016/0231386 A1 | 8/2016 | Sung et al. |
| 2017/0045587 A1 | 2/2017 | Kim et al. |
| 2017/0123009 A1 | 5/2017 | You et al. |
| 2017/0288414 A1 | 10/2017 | Klein et al. |
| 2019/0120912 A1* | 4/2019 | Chen ................. H02J 7/0029 |
| 2019/0277916 A1* | 9/2019 | Sun ................... H01M 10/613 |

* cited by examiner

METHOD AND APPARATUS WITH BATTERY MANAGEMENT

CROSS-REFERENCE TO RELATED APPLICATIONS

This application is a continuation of U.S. application Ser. No. 16/512,484 filed on Jul. 16, 2019, which claims the benefit under 35 USC § 119(a) of Korean Patent Application No. 10-2019-0003843 filed on Jan. 11, 2019 in the Korean Intellectual Property Office, the entire disclosures of which are incorporated herein by reference for all purposes.

BACKGROUND

1. Field

The following description relates to a method and an apparatus with battery management.

2. Description of Related Art

There are various methods of estimating a state of a battery. For example, a state of a battery may be estimated using a battery model, such as an equivalent circuit model or an electrochemical model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented battery management method includes: estimating state information of a plurality of battery cells in a battery pack using a first battery state estimation model; determining whether state information of at least one of the plurality of battery cells is to be estimated using a second battery state estimation model; and estimating the state information of the at least one battery cell using the second model, in response to a result of the determining being that the state information of the at least one battery cell is to be estimated using the second model.

The first model may be a lightened model including any one or any combination of any two or more of an equivalent circuit model, a current integration model, and a reduced order model to estimate state information of a battery cell using less computation than the second model.

The estimating of the state information of the plurality of battery cells in the battery pack using the first model may include determining any one or any combination of any two or more of an internal resistance of the equivalent circuit model, a capacitance of the equivalent circuit model, a representative potential of the reduced order model, and a concentration of the reduced order model.

The second model may be a precise model including an electrochemical model configured to estimate the state information of the at least one battery cell by performing a greater amount of computations than performed by the first model in estimating the state information of the at least one battery cell.

The estimating the state information of the at least one battery cell using the second model may include determining either one or both of a concentration distribution and a potential in an electrode in the electrochemical model.

The determining may include determining either one or both of whether the state information of the at least one battery cell estimated by the first model is abnormal state information and whether a preset time has elapsed since a previous estimation of battery cell state information using the second model.

The determining of whether the state information of the at least one battery cell estimated by the first model is abnormal state information may include comparing a reference value to either one or both of the state information of the at least one battery cell estimated by the first model, and a value derived from the state information of the at least one battery cell estimated by the first model.

The previous estimation of battery cell state information using the second model may include a previous estimation of state information of any one of the plurality of the battery cells using the second model.

The method of claim 1, wherein the determining comprises determining that the state information of the at least one battery cell is to be estimated using the second model in response to determining that the state information of the at least one battery cell estimated by the first model is abnormal state information.

The determining may include: determining that state information of the at least one battery cell is to be estimated using the second model based on a predetermined battery cell selection scheme, in response to a preset time elapsing.

The predetermined battery cell selection scheme may include either one or both of: a round-robin scheme wherein the at least one battery cell is selected from among the plurality of battery cells based on a sequential order of the plurality of battery cells; and a random scheme wherein the at least one battery cell is randomly selected from among the plurality of battery cells.

The determining may include determining whether a difference between the state information of the at least one battery cell estimated by the first model and the state information of another battery cell of the plurality of battery cells estimated by the first model is greater than or equal to a reference value.

The determining may include: determining a rate of change over time of the state information of the at least one battery cell estimated by the first model; and determining whether the rate of change is greater than or equal to a reference rate to indicate whether the state information of the at least one of the plurality of battery cells is to be estimated using the second model.

The determining may include determining whether the state information of the at least one battery cell estimated by the first model is within a reference range to indicate whether the state information of the at least one of the plurality of battery cells is to be estimated using the second model.

The method of claim 1, wherein the determining comprises determining whether a preset time has elapsed since a previous estimation of battery cell state information using the second model to indicate whether the state information of the at least one of the plurality of battery cells is to be estimated using the second model.

The determining may include: determining whether the state information of any one of the plurality of battery cells estimated by the first model is abnormal state information; determining whether a preset time has elapsed since a previous estimation of battery cell state information using the second model, in response to determining that none of the state informations of the plurality of battery cells are abnormal state information; and determining that the state information of the at least one battery cell is to be estimated using the second model in response to either one of determining that the state information of the at least one battery cell estimated by the first model is abnormal state information, and determining that the preset time has elapsed.

The determining may include determining that the state information of the at least one battery cell is not to be estimated using the second model in response to determining that none of the state informations of the plurality of battery cells are abnormal state information and the preset time has not elapsed.

The method may include: verifying whether the state information of the at least one battery cell estimated using the second model is abnormal state information; and transmitting, to an external system, information indicating that the state information of the at least one battery cell is abnormal, in response to verifying that the state information of the at least one battery cell estimated using the second model is abnormal state information.

The state information of the plurality of battery cells may include either one or both of states of charge (SOCs) and states of health (SOHs) of the plurality of battery cells.

A non-transitory computer-readable storage medium may store instructions that, when executed by one or more processors, cause the one or more processors to perform method.

In another general aspect, a battery management apparatus includes: one or more processors configured to: estimate state information of a plurality of battery cells in a battery pack using a first battery state estimation model, determine whether state information of at least one of the plurality of battery cells is to be estimated using a second battery state estimation model, and estimate the state information of the at least one battery cell using the second model, in response to determining that the state information of the at least one battery cell is to be estimated using the second model.

For the determining, the one or more processors may be configured to determine either one or both of whether the state information of the at least one battery cell estimated by the first model is abnormal state information and whether a preset time has elapsed since a previous estimation of battery cell state information using the second model.

For the determining, the one or more processors may be configured to determine that the state information of the at least one battery cell is to be estimated using the second model in response to determining that the state information of the at least one battery cell estimated by the first model is abnormal state information.

For the determining, the one or more processors may be configured to determine that state information of the at least one battery cell is to be estimated using the second model based on a predetermined battery cell selection scheme, in response to a preset time elapsing.

The apparatus may include a memory storing instructions that, when executed by the one or more processors, configure the one or more processors to perform: the estimating of the state information of the plurality of battery cells using the first model, the determining of whether the state information of the at least one of the plurality of battery cells is to be estimated using the second model, and the estimating of the state information of the at least one battery cell using the second model.

Other features and aspects will be apparent from the following detailed description, the drawings, and the claims.

Figure 1:
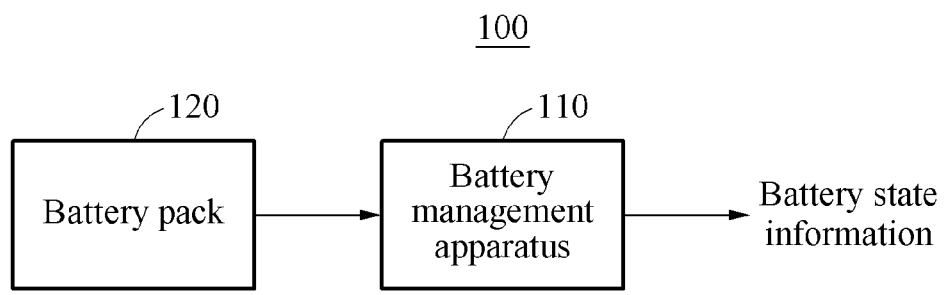
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

Hereinafter, examples are described in detail with reference to the accompanying drawings. The following specific structural or functional descriptions are exemplary to merely describe the examples, and the scope of the examples is not limited to the descriptions provided in the present specification. Various changes and modifications can be made thereto by those of ordinary skill in the art. Like reference numerals in the drawings denote like elements, and a known function or configuration will be omitted herein.

FIG. 1 illustrates an example of a battery system.

Referring to FIG. 1, a battery system 100 may include a battery management apparatus 110 and a battery pack 120.

The battery pack 120 may include a plurality of battery modules, and each of the battery modules may include a plurality of battery cells. The battery pack 120 may include a condenser or a secondary cell configured to store power as a result of a charging operation. An apparatus including the battery pack 120 may supply power produced by the battery pack 120 to a load.

The battery management apparatus 110 may be implemented by a battery management system (BMS), and may perform, for example, an operation of monitoring a state of the battery pack 120, an operation of maintaining an optimized condition of the battery pack 120, an operation of predicting a time to replace the battery pack 120, an operation of detecting a problem of the battery pack 120, and/or an operation of controlling a state or an operation of the battery pack 120 by generating a control or instruction signal related to the battery pack 120.

The battery management apparatus 110 may obtain sensed information of the plurality of battery cells in the battery pack 120. For example, the sensed information may include voltage information, current information, and/or temperature information.

The battery management apparatus 110 may estimate battery state information based on the sensed information, and output a corresponding result. The battery state information may be state information of the plurality of battery cells. The state information may include, for example, a state of charge (SOC) and/or a state of health (SOH). However, examples are not limited thereto.

The SOC may be a parameter indicating a charge level of a battery. The SOC may indicate an amount of energy stored in the battery, and the amount may be indicated as 0% to 100%. For example, 0% may indicate a fully discharged state and 100% may indicate a fully charged state. Such a metric may be variously modified in varied examples, for example, defined depending on a design intention or an aspect of such examples. The SOC may be estimated or measured using various schemes.

The SOH may be a parameter quantitatively indicating a change in a lifetime characteristic of the battery caused by deterioration. The SOH may indicate, for example, a degradation level of a life or a capacity of the battery. The SOH may be estimated or measured using various schemes. For example, the SOH may indicate an amount of battery degradation of the battery, and the amount may be indicated as 0% to 100%. For example, 0% may indicate a fully degraded battery and 100% may indicate that the battery's conditions match the battery's specifications.

Hereinafter, an example of estimating battery state information will be described in detail with reference to FIG. 2.

Figure 2:
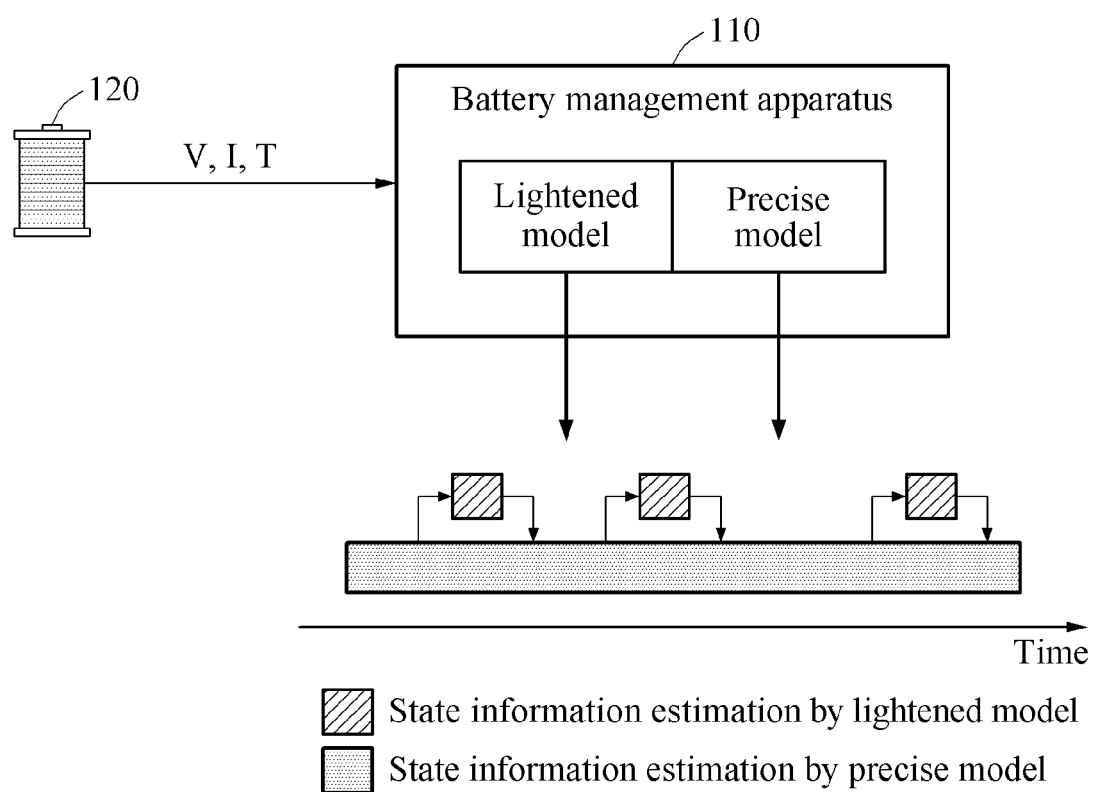
FIG. 2 illustrates an example of using a lightened model and a precise model.

FIG. 2 illustrates an example of using a lightened model and a precise model.

Referring to FIG. 2, the battery management apparatus 110 may estimate state information of the plurality of battery cells in the battery pack 120 using at least one of a lightened model and a precise model.

The lightened model may be a model configured to estimate state information using fewer computations than the computations used by the precise model to estimate the state information, and the lightened model may include, for example, an equivalent circuit model, a current integration model, and/or a reduced order model (that is, a reduced order electrochemical model). Since the lightened model may estimate state information using fewer computations than the precise model, the lightened model may use a smaller amount of information than the precise model for estimating the state information, and an accuracy of the state information estimated by the lightened model may be relatively low or lower compared to an accuracy of the state information estimated by the precise model. The state information estimated by the lightened model may include (or may be based on) any one or any combination of any two or more of an internal resistance of the equivalent circuit model, a capacitance of the equivalent circuit model, a representative potential of the reduced order model, and a concentration of the reduced order model.

Here, the equivalent circuit model may be a model configured to estimate an amount of power remaining in a battery by forming a virtual circuit using a resistor and a capacitor to represent a voltage value changing when the battery is charged or discharged. The current integration model may be a model configured to estimate an amount of power remaining in a battery by summing up quantities of electric charges used for charging or discharging the battery through a current sensor provided at a terminal of the battery. The reduced order model may be a model configured to reduce a dimension of an internal physical phenomenon in a battery (for example, an ion concentration of the battery) to a one-dimension.

The precise model may be a model configured to estimate state information using more computations than the computations used by the lightened model, and may include, for example, an electrochemical model. Since the precise model may estimate state information using more computations than the lightened model, the precise model may use a greater amount of information than the lightened model for estimating the state information, and an accuracy of the state information estimated by the precise model may be relatively high or higher compared to an accuracy of the state information estimated by the lightened model. The state information estimated by the precise model may include at least one of a concentration distribution and a potential in an electrode in the electrochemical model. Here, the electrochemical model may be a model configured to estimate an amount of power remaining in the battery by modeling an internal physical phenomenon in the battery, for example, an ion concentration of the battery, and may include, for example, a full order model.

The battery management apparatus 110 may use the lightened model to estimate the state information of the plurality of battery cells in the battery pack 120. The lightened model may perform a relatively small amount of computations to estimate the state information (compared to, e.g., the precise model) and thus, the lightened model may be driven (or implemented) in real time in the battery management apparatus 110. The lightened model may estimate the state information of the plurality of battery cells based on a predetermined condition (for example, estimating the state information of the plurality of battery cells at a minimum update interval of 100 ms, as a non-limiting example).

The battery management apparatus 110 may temporarily use the precise model that uses a relatively large or larger amount of computations to estimate state information (compared to, e.g., the lightened model) when it is advantageous to estimate state information of at least one of the plurality of battery cells in the battery pack 120 (e.g., a specific battery cell or a specific group of battery cells in the battery pack 120). Since a large amount of computations may be used to estimate the state information using the precise model, it may be advantageous to avoid driving (or implementing) the precise model in real time in the battery management apparatus 110, to thereby reduce the required processing power. Thus, instead of implementing the precise model in real time, the precise model may be used to estimate state information of some battery cells (e.g., specific battery cells) when precise estimation of the state information of such battery cells is advantageous.

In response to a determination that some battery cells include abnormal state information as a result of estimating the state information of the plurality of battery cells based on the lightened model, the battery management apparatus 110 may precisely estimate the state information of the corresponding battery cells based on the precise model. Through this, the battery management apparatus 110 may accurately determine whether the corresponding abnormal state information is an estimation error of the lightened model, or whether the corresponding battery cells actually include abnormal state information, and the battery management apparatus 110 may perform an appropriate succeeding operation.

Although abnormal state information may not be detected through the lightened model, the battery management apparatus 110 may select a portion of the plurality of battery cells, perform state information estimation based on the precise model for the selected portion, and may correct or supplement an estimation result of the lightened model using a result of the performing of the state information estimation based on the precise model.

As described above, the battery management apparatus 110 may estimate state information by switching between the lightened model and the precise model, thereby monitoring state information in real time based on the lightened model while improving an estimation accuracy by utilizing the precise model, which produces a greater processing load than the lightened model, even if hardware of the battery management apparatus 110 includes low-specification hardware.

Figure 3:
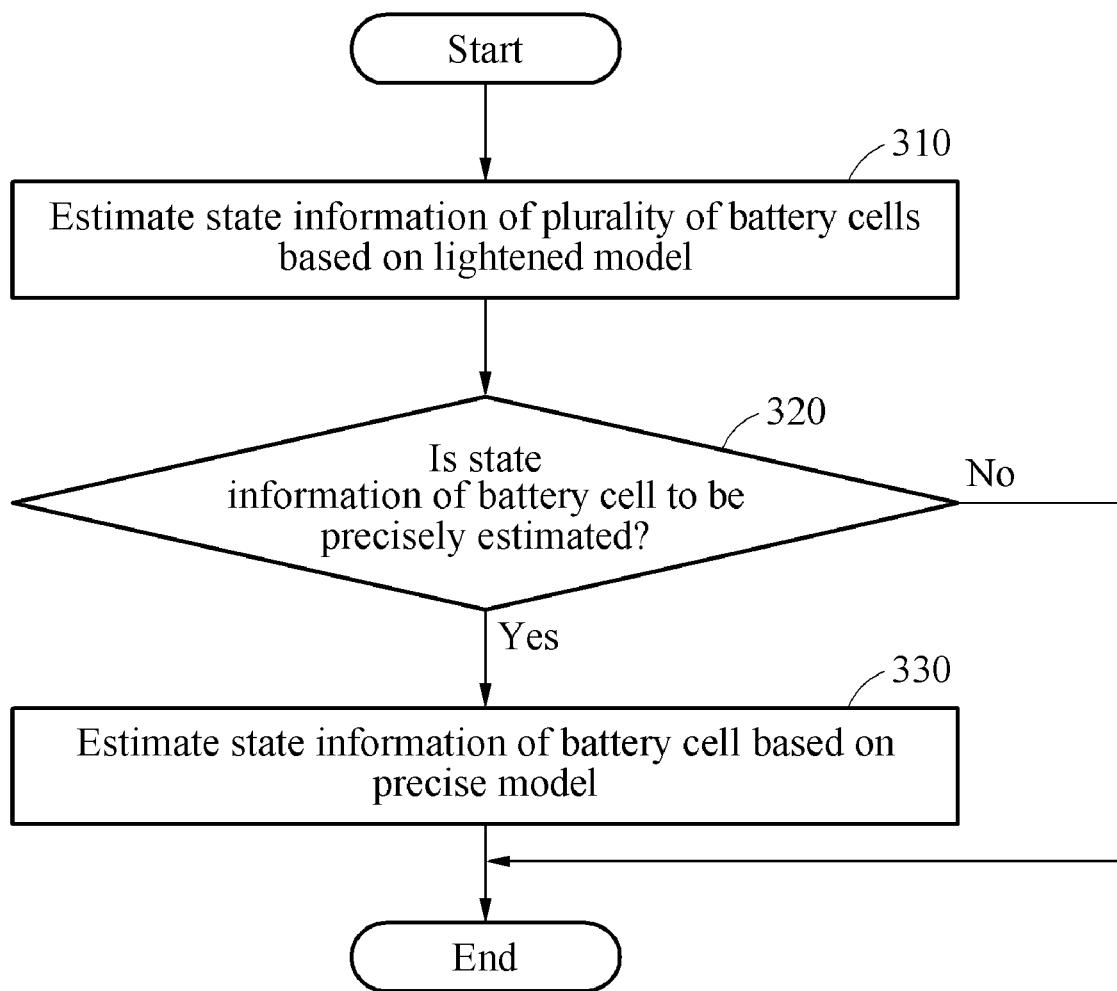
FIG. 3 illustrates an example of a battery management method.

FIG. 3 illustrates an example of a battery management method.

Referring to FIG. 3, a battery management method performed by a processor (e.g., the processor may be representative of one or more processors) included in a battery management apparatus is illustrated.

In operation 310, the battery management apparatus may estimate state information of a plurality of battery cells in a battery pack based on a lightened model. For example, the battery management apparatus may estimate the state information of all the battery cells in the battery pack in real time based on the lightened model.

In operation 320, the battery management apparatus may determine whether state information of at least one of the plurality of battery cells is to be precisely estimated. For example, the battery management apparatus may determine whether the state information of the at least one battery cell is to be precisely estimated, based on either one or both of whether there is at least one battery cell having abnormal state information among the plurality of battery cells and whether a time preset for precise estimation elapses. For example, in operation 320, the battery management apparatus may determine that state information of at least one of the plurality of battery cells is to be precisely estimated in response to determining that there is at least one battery cell having abnormal state information among the plurality of battery cells and/or determining that a time preset for precise estimation has elapsed. As another example, in operation 320, the battery management apparatus may determine that state information of at least one of the plurality of battery cells is not to be precisely estimated in response to determining that there is not at least one battery cell having abnormal state information among the plurality of battery cells and/or determining that a time preset for precise estimation has not elapsed. A process of determining whether state information of at least one battery cell is to be precisely estimated will be described further with reference to FIGS. 4 and 5.

In response to a determination that the state information of the at least one battery cell is to be precisely estimated, the battery management apparatus may estimate the state information of the at least one battery cell based on a precise model, in operation 330. The battery management apparatus may determine, through precise estimation, whether the abnormal state information of the battery cell estimated in operation 310 is an error of the lightened model or whether the corresponding battery cell actually includes abnormal state information (e.g., thereby determining that the abnormal state information of the battery cell estimated in operation 310 is accurate).

In response to the state information estimated based on the precise model (e.g., the state information estimated in operation 330) being different from the state information estimated based on the lightened model (e.g., the state information estimated in operation 310), the battery management apparatus may manage the corresponding battery cell based on the state information estimated based on the precise model (and not based on the state information estimated based on the lightened model, for example). As another example, in response to the state information estimated based on the precise model being different from the state information estimated based on the lightened model, the battery management apparatus may correct or supplement the state information estimated based on the lightened model, based on the state information estimated based on the precise model.

In response to a determination that the state information of the at least one battery cell is not to be precisely estimated in operation 320, operation 330 may not be performed. Instead, the battery management apparatus may manage the plurality of battery cells based on the state information estimated in operation 310.

Figure 4:
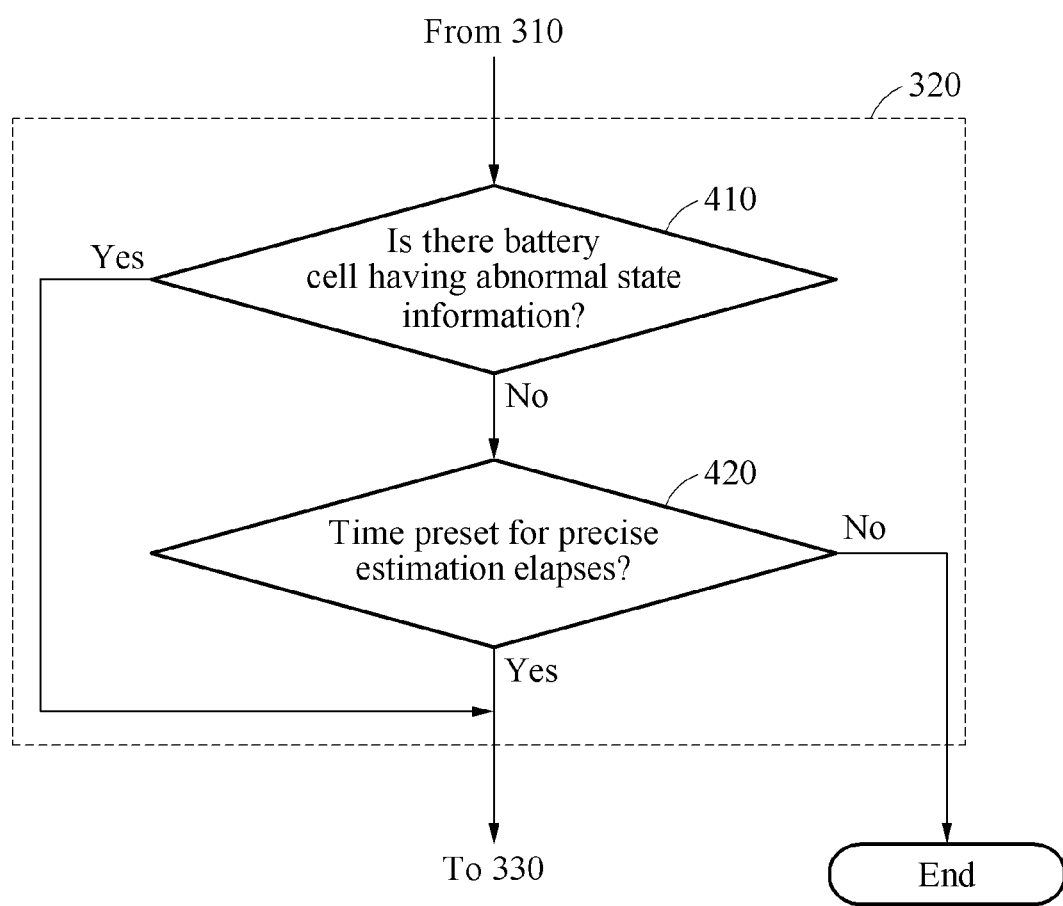
FIG. 4 illustrates an example of determining whether to perform precise estimation.

FIG. 4 illustrates an example of determining whether to perform precise estimation.

Referring to FIG. 4, a process of determining whether to perform precise estimation (e.g., operation 320 of FIG. 3) performed by a processor (e.g., the processor may be representative of one or more processors) included in a battery management apparatus is illustrated.

In operation 410, the battery management apparatus may determine whether there is at least one battery cell having abnormal state information among a plurality of battery cells. For example, in operation 410, the battery management apparatus may determine whether there is at least one battery cell having abnormal state information, based on any one or any combination of (a) whether there is at least one battery cell of which a state information difference from another battery cell is greater than or equal to a reference value, among the plurality of battery cells, (b) whether there is at least one battery cell of which a rate of change in state information over time is greater than or equal to a reference rate, among the plurality of battery cells, and (c) whether there is at least one battery cell of which state information is out of a reference range, among the plurality of battery cells. For example, in operation 410, the battery management apparatus may determine there is at least one battery cell having abnormal state information in response to determining that (a) there is at least one battery cell of which a state information difference from another battery cell is greater than or equal to a reference value, among the plurality of battery cells, (b) there is at least one battery cell of which a rate of change in state information over time is greater than or equal to a reference rate, among the plurality of battery cells, and/or (c) there is at least one battery cell of which state information is out of a reference range, among the plurality of battery cells. In another example, in operation 410, the battery management apparatus may determine there is not at least one battery cell having abnormal state information in response to determining that (a) there is not at least one battery cell of which a state information difference from another battery cell is greater than or equal to a reference value, among the plurality of battery cells, (b) there is not at least one battery cell of which a rate of change in state information over time is greater than or equal to a reference rate, among the plurality of battery cells, and/or (c) there is not at least one battery cell of which state information is out of a reference range, among the plurality of battery cells.

In response to a determination that there is at least one battery cell having abnormal state information among the plurality of battery cells, the battery management apparatus may determine that the state information of the at least one battery cell is to be precisely estimated, and then operation 330 may be performed.

In response to a determination that there is not at least one battery cell having abnormal state information among the plurality of battery cells, the battery management apparatus may determine whether a time preset for precise estimation elapses, in operation 420. For example, the battery management apparatus may determine whether the preset time has elapsed since a point in time of a previous precise estimation.

Further, in response to an elapse of the time preset for precise estimation, the battery management apparatus may determine that state information of at least one battery cell selected based on a predetermined rule (e.g., a predetermined battery cell selection schemed) from among the plurality of battery cells is to be precisely estimated. For example, the predetermined rule may include a round-robin scheme which sequentially selects a battery cell, and/or a random scheme which randomly selects a battery cell of which state information is to be precisely estimated from among the plurality of battery cells.

As described above, although there may not be a battery cell having abnormal state information, the battery management apparatus may select a portion of the plurality of battery cells at a predetermined interval and may perform precision estimation thereon, thereby maintaining a relatively high estimation accuracy.

In response to a determination that the time preset for precise estimation is yet to elapse in operation 420, the battery management apparatus may determine not to perform precise estimation.

Figure 5:
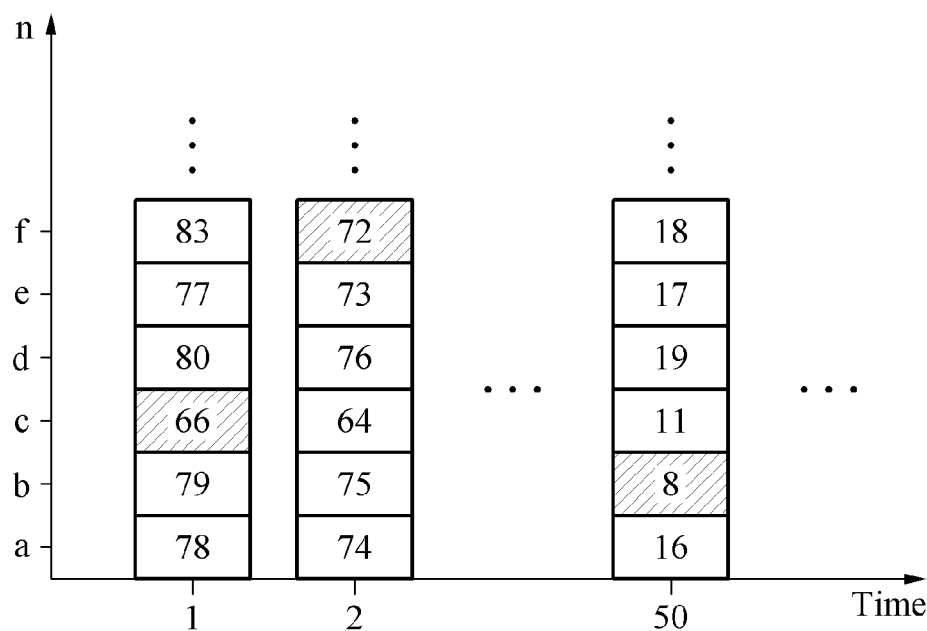
FIG. 5 illustrates an example of determining whether there is a battery cell having abnormal state information.

FIG. 5 illustrates an example of determining whether there is a battery cell having abnormal state information.

Referring to FIG. 5, an example of detecting a battery cell having abnormal state information is illustrated. In FIG. 5, a horizontal axis denotes a point in time (e.g., wherein units of the horizontal axis are seconds, minutes, or any other unit of time), a vertical axis denotes identification information of a plurality of battery cells (e.g., each letter (a) through (f) may correspond a different battery cell), and a number in a box denotes information estimated based on a lightened model, which may be an example of state information of a predetermined battery cell at a predetermined point in time. The state information may include, for example, a state of charge (SOC) and/or a state of health (SOH). For example, state information of a battery cell (a) at a point in time 1 (e.g., at 1 second) may be 78 (e.g., 78% SOC or 78% SOH). FIG. 5 illustrates an example of state information for ease of description. An operation of a battery management apparatus described herein is not limited thereto.

For example, at the point in time 1, the battery management apparatus may estimate state information of a plurality of battery cells based on the lightened model. The battery management apparatus may notice or determine that state information 66 of a battery cell (c) is substantially lower than state information of the other battery cells, and may detect the battery cell (c) as a battery cell having abnormal state information. As described above, the battery management apparatus may detect a battery cell of which state information is substantially lower or higher than state information of the other battery cells, that is, a battery cell of which a state information difference from another battery cell is greater than or equal to a reference value, among the plurality of battery cells, as a battery cell having abnormal state information.

Further, state information may decrease over time as power stored in a battery cell is used. The battery management apparatus may verify a rate of change in the state information by comparing state information of a plurality of points in time. The battery management apparatus may compare state information at the point in time 1 and state information at a point in time 2, thereby verifying a rate of change in the state information during a corresponding period. In this example, the battery management apparatus may notice that a rate of change in state information of a battery cell (f) exceeds a non-limiting example 10% reference rate (e.g., the state information of battery (f) decreases from 83 to 72 from point in time 1 to point in time 2, as shown in FIG. 5), and may thereby detect the battery cell (f) as a battery cell having abnormal state information. As described above, the battery management apparatus may detect a battery cell of which a rate of change in state information over time is greater than or equal to a reference rate as a battery cell having abnormal state information.

Further, at a point in time 50, the battery management apparatus may estimate state information of the plurality of battery cells based on the lightened model. The battery management apparatus may notice that state information 8 of a battery cell (b) is out of a safe range (for example, a safe range of 10 to 95, as a non-limiting example) and may thereby detect the battery cell (b) as a battery cell having abnormal state information. As described above, the battery management apparatus may detect a battery cell of which state information is out of a reference range as a battery cell having abnormal state information.

Figure 6:
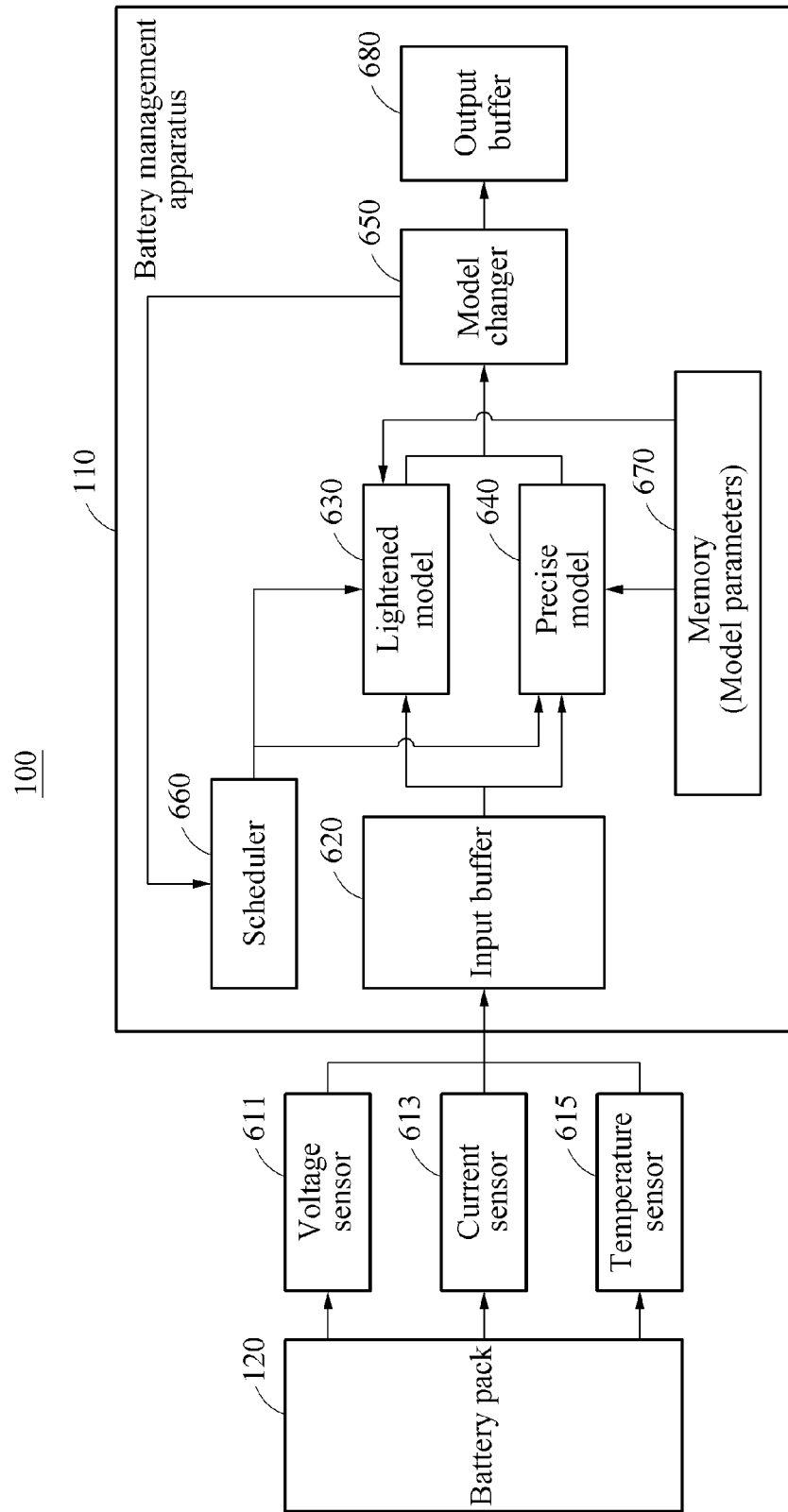
FIG. 6 illustrates an example of a battery system.

FIG. 6 illustrates an example of a battery system.

Referring to FIG. 6, the battery system 100 may include the battery management apparatus 110, the battery pack 120, and sensors 611, 613, and 615. In the example of FIG. 6, the battery management apparatus 110 may include an input buffer 620, a lightened model 630, a precise model 640, a model changer 650, a scheduler 660, a memory 670, and an output buffer 680.

The voltage sensor 611 may sense voltages of the battery cells in the battery pack 120 and may store voltage information in the input buffer 620. The current sensor 613 may sense currents of the battery cells in the battery pack 120 and may store current information in the input buffer 620. The temperature sensor 615 may sense temperatures of the battery cells in the battery pack 120 and may store temperature information in the input buffer 620.

The input buffer 620 may store the sensed information received from the sensors 611, 613, and 615. In this example, a clock may record a time at which the sensed information is stored.

The scheduler 660 may select a model to be used to estimate the state information between the lightened model 630 and the precise model 640. In this example, the scheduler 660 may select one or both of the lightened model 630 and the precise model 640. For example, when the state information of the plurality of battery cells is yet to be estimated, the scheduler 660 primarily may select the lightened model 630.

The lightened model 630 may estimate the state information of the plurality of battery cells in the battery pack 120 based on the sensed information stored in the input buffer 620. The model changer 650 may determine whether a model change is needed based on the state information estimated by the lightened model 630. For example, in response to a determination that the state information estimated by the lightened model 630 is abnormal, the model changer 650 may determine to change a model to the precise model 640. Although it may not be determined that the state information estimated by the lightened model 630 is abnormal, in response to an elapse of a time preset for precise estimation, the model changer 650 may determine to change a model to the precise model 640. In response to the model changer 650 determining to change a model, the scheduler 660 may select a model corresponding to the determination of the model changer 650. The model changer 650 may directly determine whether to use the precise model 640 based on the sensed information received from the input buffer 620. The model changer 650 also may determine whether there is at least one battery cell having abnormal state information based on whether there is at least one battery cell of which a voltage is out of a predetermined voltage range among the plurality of battery cells and/or whether there is at least one battery cell of which a temperature is out of a predetermined temperature range among the plurality of battery cells.

In response to the precise model 640 being selected, the precise model 640 may estimate state information of at least one of the plurality of battery cells based on the sensed information stored in the input buffer 620. The state information estimated by the precise model 640 may be stored in the output buffer 680. With respect to a battery cell of which state information is not estimated by the precise model 640, state information thereof estimated by the lightened model 630 may be stored in the output buffer 680.

The memory 670 may store model parameters of the lightened model 630 and the precise model 640. The model parameters may be parameters learned before state information estimation is performed.

In response to a determination that the state information estimated by the precise model 640 as well as the state information estimated by the lightened model 630 is abnormal, the battery management apparatus 110 may transmit a corresponding determination result to an external system. The battery management apparatus 110 may determine whether the abnormal state information results from a simple unbalance between the plurality of battery cells or results from abnormal deterioration, based on an estimation result of at least one of the lightened model 630 and the precise model 640, and may transmit a corresponding determination result to the external system. For example, the external system may be a vehicle control unit (VCU), an electronic control unit (ECU), a charger at an electric vehicle charging station, a measuring instrument at a vehicle repair shop, a mobile terminal of a user using a device including the battery management apparatus 110, or a smart device.

In an example, the description provided with reference to FIGS. 1 through 5 may apply to the battery management apparatus 110 of FIG. 6, and thus duplicated description will be omitted for conciseness.

Figure 7:
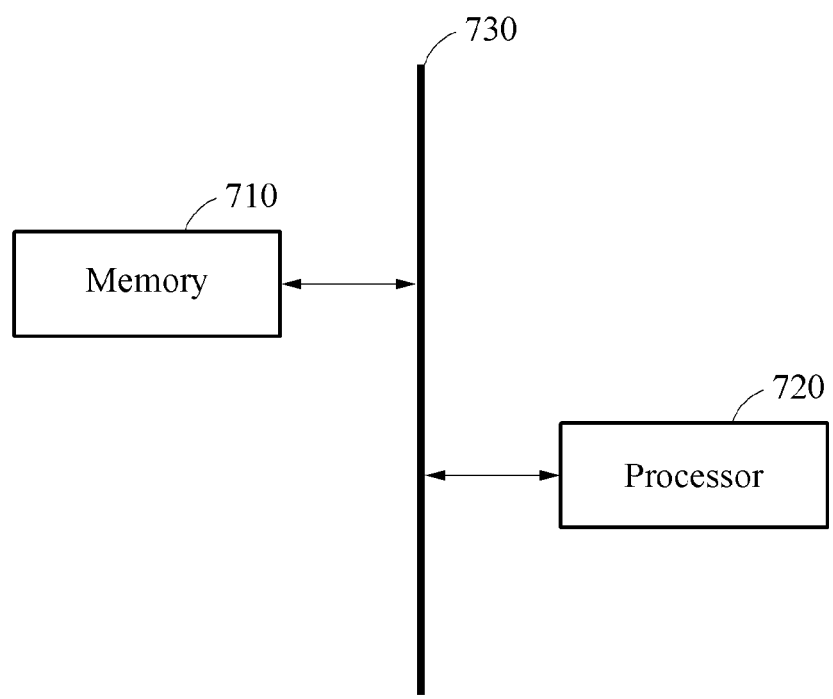
FIG. 7 illustrates an example of a battery management apparatus.

FIG. 7 illustrates an example of a battery management apparatus.

Referring to FIG. 7, a battery management apparatus 700 may include a memory 710 and a processor 720 (e.g., the processor 720 may be representative of one or more processors). The memory 710 and the processor 720 may communicate with each other through a bus 730.

The memory 710 may include computer-readable instructions. The processor 720 may perform the operations described above when the instructions stored in the memory 710 are executed by the processor 720.

The processor 720 may estimate state information of a plurality of battery cells in a battery pack based on a lightened model, may determine whether state information of at least one of the plurality of battery cells is to be precisely estimated, and may estimate the state information of the at least one battery cell based on a precise model, in response to a determination that the state information of the at least one battery cell is to be precisely estimated.

The battery management apparatus 700 may estimate the state information based on the lightened model at all times, and may estimate a state information based on the precise model irregularly or regularly, thereby estimating the state information in real time such that a minimum update interval is satisfied while providing a relatively high estimation accuracy.

In addition, the battery management apparatus 700 may perform the operations described above.

Figure 8:
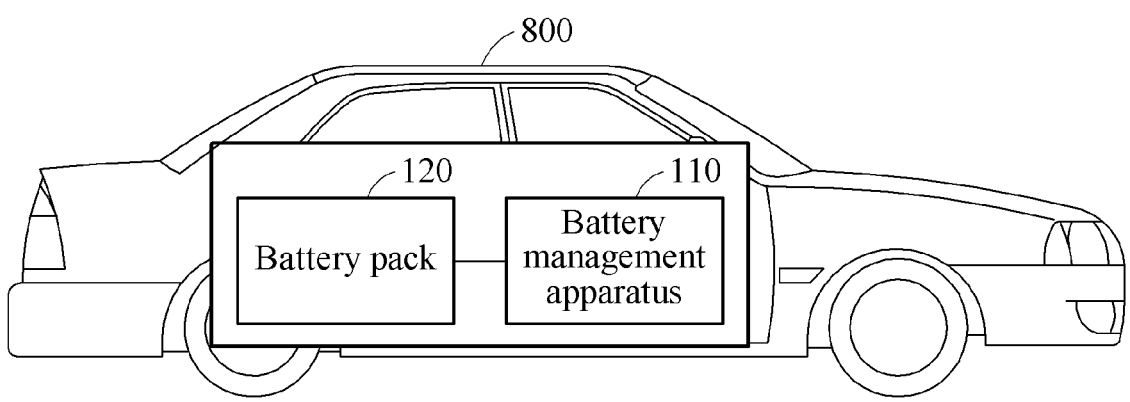
FIGS. 8 and 9 illustrate examples of a vehicle.
Figure 9:
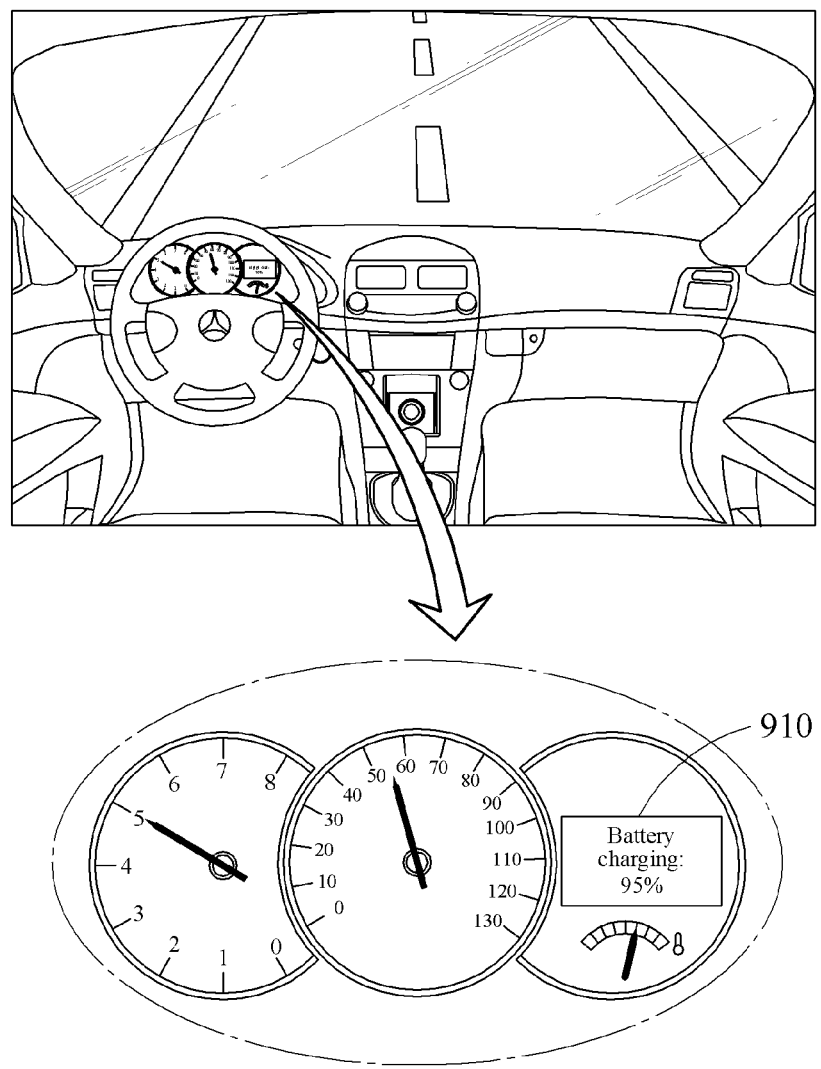

FIGS. 8 and 9 illustrate examples of a vehicle.

Referring to FIG. 8, an example embodiment vehicle 800 may include the battery pack 120 and the battery management apparatus 110. In another example, the vehicle 800 may be representative of the battery management apparatus 110. The vehicle 800 may use the battery pack 120 as a power source. The vehicle 800 may be, for example, an electric vehicle or a hybrid vehicle.

The battery pack 120 may include a plurality of battery modules. A battery module may include a plurality of battery cells.

The battery management apparatus 110 monitors whether an abnormality occurs in the battery pack 120, and prevents over-charging or over-discharging of the battery pack 120. Further, the battery management apparatus 110 may perform thermal control with respect to the battery pack 120 in response to a temperature of the battery pack 120 exceeding a first temperature, for example, 40° C., or being less than a second temperature, for example, −10° C. In addition, the battery management apparatus 110 may perform cell balancing such that charge states of battery cells in the battery pack 120 are equalized.

When the battery pack 120 is partially or fully charged, the battery management apparatus 110 may determine state information of each of the battery cells in the battery pack 120 or state information of the battery pack 120. Further, when the battery pack 120 is partially or fully discharged, the battery management apparatus 110 may determine state information of each of the battery cells in the battery pack 120 or state information of the battery pack 120.

The battery management apparatus 110 may transmit the state information of the battery pack 120 to an ECU or a VCU of the vehicle 800. The ECU or the VCU of the vehicle 800 may output the state information of the battery pack 120 on a display of the vehicle 800. As shown in the example of FIG. 9, the ECU or the VCU may display the state information of the battery pack 120 on a dashboard 910 of the vehicle 800. The ECU or the VCU may display a remaining travel distance determined based on the estimated state information on the dashboard 910. The ECU or the VCU may display the state information of the battery pack 120 and the remaining travel distance on a head-up display (HUD) of the vehicle 800.

In an example, the description provided with reference to FIGS. 1 through 7 applies to the description of FIGS. 8 and 9, and thus duplicated description will be omitted for conciseness.

The battery management apparatuses, battery management apparatus 110, battery pack 120, sensor 611, sensor 613, sensor 615, input buffer 620, lightened model 630, precise model 640, model changer 650, scheduler 660, memory 670, output buffer 680, battery management apparatus 700, memory 710, processor 720, bus 730, vehicle 800, dashboard 910, and other apparatuses, modules, devices, and other components described herein with respect to FIGS. 1-9 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented battery management method, comprising:
    estimating state information of a plurality of battery cells in a battery pack using a first battery state estimation model;
    determining whether state information of at least one of the plurality of battery cells is to be estimated using a second battery state estimation model based on one or both of whether the state information of the at least one battery cell estimated by the first model is abnormal state information and whether a preset time has elapsed since a previous estimation of battery cell state information using the second model; and
    estimating the state information of the at least one battery cell using the second model, in response to a result of the determining being that the state information of the at least one battery cell is to be estimated using the second model.

2. The method of claim 1, wherein the first model is a lightened model including any one or any combination of any two or more of an equivalent circuit model, a current integration model, and a reduced order model to estimate state information of a battery cell using less computation than the second model.

3. The method of claim 2,
    wherein the estimating of the state information of the plurality of battery cells in the battery pack using the first model includes determining any one or any combination of any two or more of an internal resistance of the equivalent circuit model, a capacitance of the equivalent circuit model, a representative potential of the reduced order model, and a concentration of the reduced order model.

4. The method of claim 1, wherein the second model is a precise model including an electrochemical model, and
    wherein the second battery state estimation model estimates the state information of the at least one battery cell by performing a greater amount of computations than performed by the first model in estimating the state information of the at least one battery cell.

5. The method of claim 1, wherein the second battery state estimation model estimates the state information of the at least one battery cell by performing a greater amount of computations than performed by the first model in estimating the state information of the at least one battery cell.

6. The method of claim 1, wherein the estimating the state information of the at least one battery cell using the second model includes determining either one or both of a concentration distribution and a potential in an electrode in an electrochemical model.

7. The method of claim 1, wherein the determining of whether the state information of the at least one battery cell estimated by the first model is abnormal state information includes comparing a reference value to either one or both of the state information of the at least one battery cell estimated by the first model, and a value derived from the state information of the at least one battery cell estimated by the first model.

8. The method of claim 1, wherein the determining comprises:
    determining that state information of the at least one battery cell is to be estimated using the second model based on a predetermined battery cell selection scheme, in response to a preset time elapsing.

9. The method of claim 8, wherein the predetermined battery cell selection scheme includes either one or both of:
    a round-robin scheme wherein the at least one battery cell is selected from among the plurality of battery cells based on a sequential order of the plurality of battery cells; and
    a random scheme wherein the at least one battery cell is randomly selected from among the plurality of battery cells.

10. The method of claim 1, wherein the determining comprises determining whether a difference between the state information of the at least one battery cell estimated by the first model and the state information of another battery cell of the plurality of battery cells estimated by the first model is greater than or equal to a reference value.

11. The method of claim 1, wherein the determining comprises:
    determining a rate of change over time of the state information of the at least one battery cell estimated by the first model; and
    determining whether the rate of change is greater than or equal to a reference rate to indicate whether the state information of the at least one of the plurality of battery cells is to be estimated using the second model.

12. The method of claim 1, wherein the determining comprises determining whether the state information of the at least one battery cell estimated by the first model is within a reference range to indicate whether the state information of the at least one of the plurality of battery cells is to be estimated using the second model.

13. The method of claim 1, wherein the determining comprises:
    determining whether the state information of any one of the plurality of battery cells estimated by the first model is abnormal state information;
    determining whether a preset time has elapsed since a previous estimation of battery cell state information using the second model, in response to determining that none of the state informations of the plurality of battery cells are abnormal state information; and
    determining that the state information of the at least one battery cell is to be estimated using the second model in response to either one of determining that the state information of the at least one battery cell estimated by the first model is abnormal state information, and determining that the preset time has elapsed.

14. The method of claim 13, wherein the determining comprises determining that the state information of the at least one battery cell is not to be estimated using the second model in response to determining that none of the state informations of the plurality of battery cells are abnormal state information and the preset time has not elapsed.

15. The method of claim 1, further comprising:
    verifying whether the state information of the at least one battery cell estimated using the second model is abnormal state information; and
    transmitting, to an external system, information indicating that the state information of the at least one battery cell is abnormal, in response to verifying that the state information of the at least one battery cell estimated using the second model is abnormal state information.

16. The method of claim 1, wherein the state information of the plurality of battery cells includes either one or both of states of charge (SOCs) and states of health (SOHs) of the plurality of battery cells.

17. A non-transitory computer-readable storage medium storing instructions that, when executed by one or more processors, configure the one or more processors to perform the method of claim 1.

18. An apparatus, comprising:
    one or more processors configured to:
    estimate state information of a plurality of battery cells in a battery pack using a first battery state estimation model,
    determine whether state information of at least one of the plurality of battery cells is to be estimated using a second battery state estimation model based on one or both of whether the state information of the at least one battery cell estimated by the first model is abnormal state information and whether a preset time has elapsed since a previous estimation of battery cell state information using the second mode, and
    estimate the state information of the at least one battery cell using the second model by determining either one or both of a concentration distribution and a potential in an electrode in an electrochemical model, in response to determining that the state information of the at least one battery cell is to be estimated using the second model.

19. The apparatus of claim 18, wherein, for the determining, the one or more processors are configured to determine that state information of the at least one battery cell is to be estimated using the second model based on a predetermined battery cell selection scheme, in response to a preset time elapsing.

20. The apparatus of claim 18, further comprising a memory storing instructions that, when executed by the one or more processors, configure the one or more processors to perform:
    the estimating of the state information of the plurality of battery cells using the first model,
    the determining of whether the state information of the at least one of the plurality of battery cells is to be estimated using the second model, and
    the estimating of the state information of the at least one battery cell using the second model.

* * * * *